(12) United States Patent
Cho et al.

(10) Patent No.: US 8,415,182 B2
(45) Date of Patent: *Apr. 9, 2013

(54) MANUFACTURING METHOD OF THIN FILM TRANSISTOR ARRAY SUBSTRATE AND LIQUID CRYSTAL DISPLAY PANEL

(75) Inventors: An-Thung Cho, Hualien County (TW); Chia-Tien Peng, Hsinchu County (TW); Yuan-Jun Hsu, Nantou County (TW); Ching-Chieh Shih, Kinmen County (TW); Chien-Sen Weng, Hsinchu County (TW); Kun-Chih Lin, Miaoli County (TW); Hang-Wei Tseug, Tainan City (TW); Ming-Huang Chuang, Tainan City (TW)

(73) Assignee: Au Optronics Corporation, Hsinchu (TW)

( * ) Notice: Subject to any disclaimer, the term of this patent is extended or adjusted under 35 U.S.C. 154(b) by 437 days.

This patent is subject to a terminal disclaimer.

(21) Appl. No.: 12/645,448

(22) Filed: Dec. 22, 2009

(65) Prior Publication Data

US 2010/0099206 A1 Apr. 22, 2010

Related U.S. Application Data

(62) Division of application No. 12/426,301, filed on Apr. 20, 2009, now Pat. No. 7,682,883.

(30) Foreign Application Priority Data

May 16, 2008 (TW) ................................ 97118209 A
Dec. 31, 2008 (TW) ................................ 97151836 A

(51) Int. Cl.
*H01L 33/00* (2010.01)

(52) U.S. Cl.
USPC ................ 438/24; 438/30; 438/34; 438/152; 257/E21.158; 257/E21.411; 257/E33.077

(58) Field of Classification Search .................... 438/30, 438/152, 24, 34; 257/E31.048, E31.127, 257/E21.411, E21.158, E33.077
See application file for complete search history.

(56) References Cited

U.S. PATENT DOCUMENTS

| 7,242,449 B1 * | 7/2007 | Yamazaki et al. | 349/116 |
| 7,423,289 B2 * | 9/2008 | Wong | 257/57 |
| 7,682,883 B2 * | 3/2010 | Cho et al. | 438/149 |

(Continued)

FOREIGN PATENT DOCUMENTS

CN 101097335 1/2008

*Primary Examiner* — Zandra Smith
*Assistant Examiner* — Toniae Thomas
(74) *Attorney, Agent, or Firm* — Jianq Chyun IP Office

(57) ABSTRACT

A manufacturing method of a thin film transistor array substrate is provided. In the method, a substrate having a display region and a sensing region is provided. At least a display thin film transistor is formed in the display region, a first sensing electrode is formed in the sensing region, and an inter-layer dielectric layer is disposed on the substrate, covers the display thin film transistor, and exposes the first sensing electrode. A patterned photo sensitive dielectric layer is then formed on the first sensing electrode. A patterned transparent conductive layer is subsequently formed on the substrate, wherein the patterned transparent conductive layer includes a pixel electrode coupled to the corresponding display thin film transistor and includes a second sensing electrode located on the patterned photo sensitive dielectric layer. A manufacturing method of a liquid crystal display panel adopting the aforementioned thin film transistor array substrate is also provided.

13 Claims, 11 Drawing Sheets

U.S. PATENT DOCUMENTS

| | | | |
|---|---|---|---|
| 7,816,751 B2 * | 10/2010 | Cho et al. | 257/444 |
| 2007/0247556 A1 * | 10/2007 | Jang et al. | 349/38 |
| 2008/0251790 A1 * | 10/2008 | Cheng | 257/59 |
| 2009/0009675 A1 * | 1/2009 | Cho et al. | 349/43 |
| 2009/0174647 A1 * | 7/2009 | Chen et al. | 345/102 |
| 2009/0283850 A1 * | 11/2009 | Cho et al. | 257/466 |
| 2009/0286336 A1 * | 11/2009 | Cho et al. | 438/24 |
| 2010/0012937 A1 * | 1/2010 | Lee et al. | 257/59 |
| 2010/0099206 A1 * | 4/2010 | Cho et al. | 438/25 |
| 2010/0327289 A1 * | 12/2010 | Cho et al. | 257/72 |
| 2011/0109532 A1 * | 5/2011 | Choi | 345/76 |

* cited by examiner

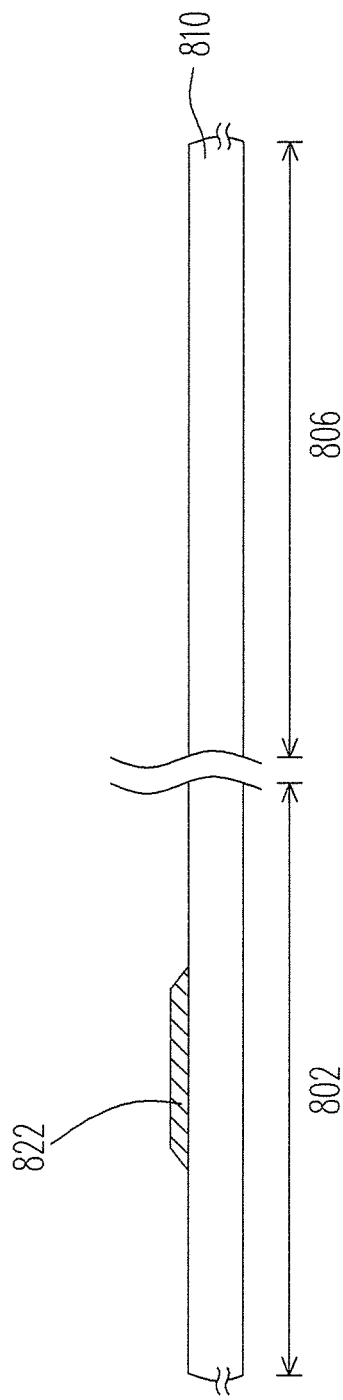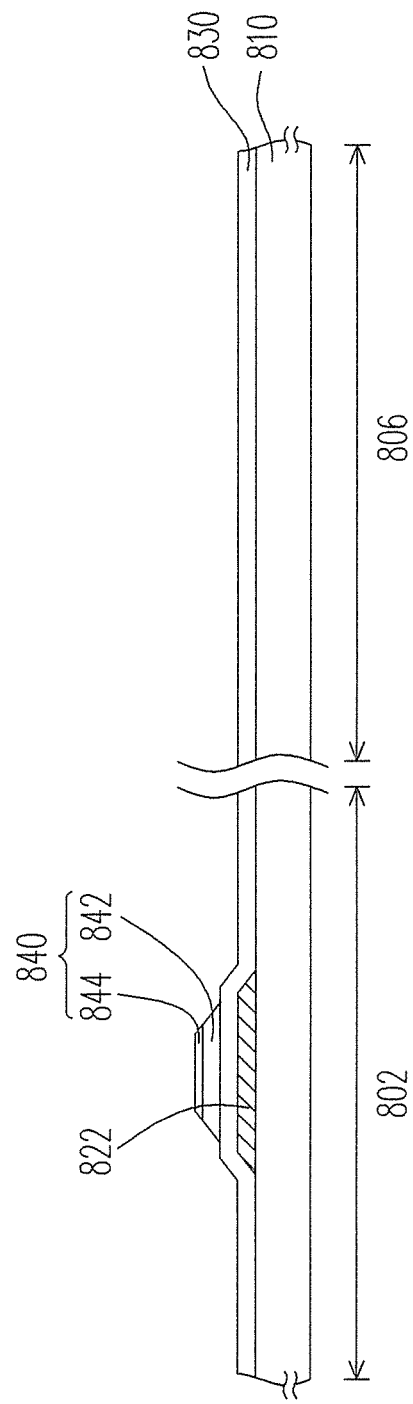

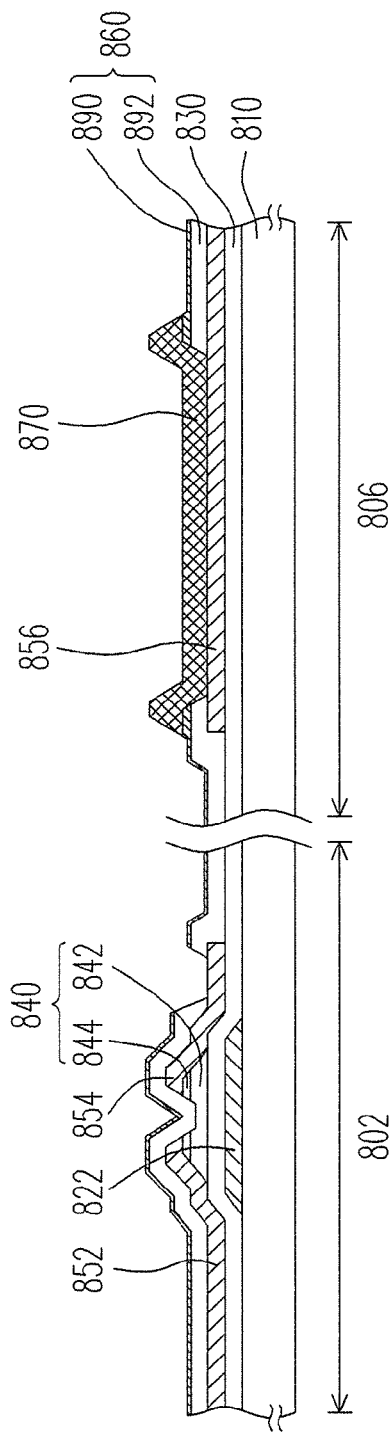
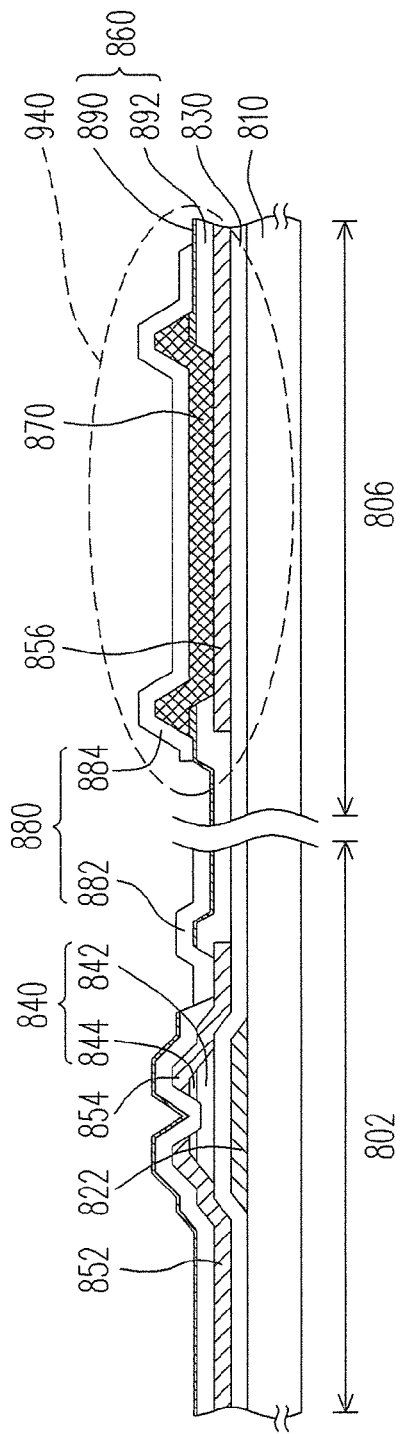

MANUFACTURING METHOD OF THIN FILM TRANSISTOR ARRAY SUBSTRATE AND LIQUID CRYSTAL DISPLAY PANEL

CROSS-REFERENCE TO RELATED APPLICATION

This application is a divisional application of and claims priority benefit of application Ser. No. 12/426,301, filed on Apr. 20, 2009, now allowed, which claims the priority benefit of Taiwan applications serial no. 97118209, filed on May 16, 2008 and no. 97151836, filed on Dec. 31, 2008. The entirety of each of the above-mentioned patent applications is hereby incorporated by reference herein and made a part of specification.

BACKGROUND OF THE INVENTION

1. Field of the Invention

The invention relates to a method of manufacturing a thin film transistor array substrate, and more particularly, to a method of manufacturing a thin film transistor array substrate incorporating a photo sensor.

2. Description of Related Art

With the popularity of liquid crystal and plasma displays, flat panel displays have become the so-called "multimedia board" in addition to being used for displaying images. A new development focus of the current display technology is to integrate an ambient light sensing capability in the flat panel display, which mainly is to build a photo sensor in the flat panel display in order to detect intensity of ambient light.

A current and common ambient light sensing technology is to form a p-i-n (P-type doped silicon/undoped silicon/N-type doped silicon) photo sensor on a glass substrate of a display panel through a low temperature poly-silicon (LTPS) process. However, due to limitation of the process, the p-i-n photo sensor manufactured through the LTPS process has a problem of poor photoelectric effect because of insufficient thickness of the poly-silicon film and lower sensitivity. In addition, light from a backlight source directly irradiates the p-i-n photo sensor through the glass substrate and thereby affects the photo sensing characteristics of the p-i-n photo sensor and reduces a signal to noise ratio (SNR) of a photo sensing signal, causing distortion of measurement results.

SUMMARY OF THE INVENTION

The invention relates to a manufacturing method of a thin film transistor array substrate incorporating a photo sensor which has an enlarged photo sensing area and enhanced photo sensing efficiency.

The invention further relates to a manufacturing method of a thin film transistor array substrate incorporating a photo sensor. The method can effectively prevent backlight source from irradiating the photo sensor such that the photo sensor has more accurate measurement results.

The invention further relates to a manufacturing method of a liquid crystal display panel using the afore-mentioned manufacturing method of a thin film transistor array substrate incorporating a photo sensor.

In order to specifically describe the invention, a manufacturing method of a thin film transistor array substrate is provided herein. First, a substrate having a display region and a sensing region is provided. Furthermore, a patterned semiconductor layer is formed on the substrate. The patterned semiconductor includes a semiconductor block and a first storage electrode in the display region. Next, ion doping is performed on the semiconductor block and the first storage electrode. A doped source region, a doped drain region, and a channel region between the doped source region and the doped drain region are formed in each semiconductor block. Then, a gate insulation layer is formed on the substrate to cover the semiconductor block and the first storage electrode. Afterwards, a first patterned metal layer is formed on the gate insulation layer. The first patterned metal layer includes a plurality of gate electrodes corresponding to the channel region and a plurality of second storage electrodes corresponding to the first storage electrode. Then, an inter-layer dielectric layer is formed on the gate insulation layer to cover the first patterned metal layer. Further, a plurality of first via holes are formed in the inter-layer dielectric layer and the gate insulation layer. The first via holes respectively expose the corresponding doped source region, doped drain region, and first storage electrode. Next, a second patterned metal layer is formed on the inter-layer dielectric layer. The second patterned metal layer includes a plurality of contact metal plugs, a plurality of connecting metal lines, and a first sensing electrode. The first sensing electrode is in the sensing region. Each gate electrode and the corresponding semiconductor block form a display thin film transistor. Each contact metal plug is coupled to the doped source region or the doped drain region of the corresponding display thin film transistor through the corresponding first via hole. In addition, each first storage electrode, the gate insulation layer, and the corresponding second storage electrode form a storage capacitor. Each connecting metal line couples the corresponding capacitor to the corresponding display thin film transistor through the contact metal plug in the corresponding first via hole. Then, a patterned photo sensitive dielectric layer is formed on the first photo sensing electrode and a protection layer is formed on the inter-layer dielectric layer to cover the second patterned metal layer and the patterned photo sensitive dielectric layer. Afterwards, a plurality of second via holes and an opening are formed in the protection layer. The second via holes respectively expose the corresponding connecting metal line and the opening exposes the patterned photo sensitive dielectric layer. Then, a patterned transparent conductive layer is formed on the protection layer. The patterned transparent conductive layer includes a plurality of pixel electrodes and a second sensing electrode. Each pixel electrode is coupled to the corresponding contact metal plug through the corresponding second via hole. The second sensing electrode is stacked on the patterned photo sensitive dielectric layer through the opening.

In one embodiment of the invention, the afore-mentioned ion doping on the semiconductor block and the first storage electrode includes respectively performing a first conductive type doping on the first storage electrode and performing a second conductive type doping on the semiconductor block. The first conductive type doping and the second conductive type doping are respectively P-type ion doping and N-type ion doping.

In one embodiment of the invention, the afore-mentioned step of performing second ion doping on the semiconductor block is to perform ion doping on the doped source region and the doped drain region exposed by the gate electrode by using the gate electrode as a mask after the step of forming the first patterned metal layer.

In one embodiment of the invention, the manufacturing method of a thin film transistor array substrate further includes performing ion doping with light dosage on each semiconductor block to form a lightly doped source region between the doped source region and the channel region and to form a lightly doped drain region between the doped drain region and the channel region after performing ion doping on each semiconductor block to faun the doped source region, the doped drain region, and the channel region.

In one embodiment of the invention, the afore-mentioned substrate further has a peripheral circuit region. A plurality of peripheral thin film transistors are further formed in the peripheral circuit region at the same time when the display thin film transistor is formed in the display region.

The invention further provides a manufacturing method of a thin film transistor array substrate. First, a substrate having a display region and a sensing region is provided. At least one display thin film transistor has been formed in the display region and one first sensing electrode has been in the sensing region. An inter-layer dielectric layer is further disposed on the substrate and the inter-layer dielectric layer covers the display thin film transistor and exposes the first sensing electrode. Next, a photo sensitive dielectric layer is formed on the first sensing electrode. Then, a patterned transparent conductive layer is formed on the substrate. The patterned transparent conductive layer includes a pixel electrode and a second sensing electrode. The pixel electrode is coupled to the corresponding display thin film transistor and the second sensing electrode is disposed on the patterned photo sensitive dielectric layer.

In the manufacturing method of another thin film transistor array substrate, the inter-layer dielectric layer and the first sensing electrode on the substrate have different relative positions due to difference in the manufacturing process.

For example, in the manufacturing process of the low temperature poly-silicon thin film transistor array substrate, the display thin film transistor is first formed on the substrate, then the inter-layer dielectric layer is formed to cover the display thin film transistor, and the first sensing electrode is subsequently formed on the inter-layer dielectric layer. At this time, the first sensing electrode may be manufactured at the same time when the contact metal plug and the connecting metal line are formed on the inter-layer dielectric layer. After the photo sensitive dielectric is formed and before the patterned transparent conductive layer is formed, a protection layer may further be formed on the inter-layer dielectric layer and an opening is formed in the protection layer to expose the patterned photo sensitive dielectric layer. The pixel electrode subsequently fowled is located on the patterned protection layer and is coupled downward to the corresponding display thin film transistor. The second sensing electrode is stacked on the photo sensitive dielectric layer through the opening.

The technical content provided in the invention may be applied in the manufacturing process of an amorphous silicon thin film transistor array substrate. In such manufacturing process, the first sensing electrode is first formed on the substrate, and then the inter-layer dielectric layer is formed and patterned to expose the first sensing electrode. In addition, the first sensing electrode may be formed at the same time during the process in which the display thin film transistor is formed. For example, the first sensing electrode may be formed with the same metal layer as the gate electrode of the display thin film transistor or the same metal layer as the source or drain of the display thin film transistor.

In one embodiment of the invention, to prevent the problem of over etching on the lower inter-layer dielectric layer when the photo sensitive dielectric layer is formed, a material of the inter-layer dielectric layer is preferably chosen according to a material of the photo sensitive dielectric layer. The inter-layer dielectric layer may also be formed with an etching barrier layer and a lower dielectric layer so as to increase an etching selectivity ratio.

In the above mentioned another manufacturing method of a thin film transistor array substrate, the substrate may further have a peripheral circuit region which has a plurality of peripheral thin film transistors and the subsequently formed inter-layer dielectric layer further covers the peripheral thin film transistors.

In one embodiment of the invention, the photo sensitive dielectric layer formed in the above manufacturing method includes a silicon-rich dielectric layer. A material of the silicon-rich dielectric layer includes silicon rich oxide, silicon rich nitride, silicon rich oxynitride, silicon rich carbide, silicon rich oxycarbide, hydrogenated silicon rich oxide, hydrogenated silicon rich nitride, hydrogenated silicon rich oxynitride, or a combination thereof.

In one embodiment of the invention, the method of forming the photo sensitive dielectric layer includes performing a chemical vapor deposition process to form the silicon-rich dielectric layer. In addition, an excimer laser annealing process may further be performed on the silicon-rich dielectric layer to form a silicon nanocrystal dielectric layer on the first sensing electrode.

A manufacturing method of a liquid crystal display panel adopting any of the above-mentioned thin film transistor array substrate is further provided. First, the thin film transistor array substrate is used as a first substrate and a second substrate is assembled with the first substrate. Next, a liquid crystal layer is injected between the first substrate and the second substrate to form the liquid crystal display panel.

In the manufacturing process of a thin film transistor array substrate incorporating manufacture of a photo sensor, a photo sensitive dielectric layer is formed between a transparent conductive layer and a metal electrode to sense incident light. At one side of the photo sensitive dielectric layer is the transparent conductive layer so incident light can directly irradiate the photo sensitive dielectric layer through the transparent conductive layer and thus sensing area of the photo sensor is significantly increased and so is the photo sensing efficiency. In addition, at the other side of the photo sensitive dielectric layer may be a metal electrode so backlight source can be prevented from directly irradiating the photo sensitive dielectric layer and thus possible influence by noise can be avoided.

In order to make the above and other objects, features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A~5F sequentially illustrate a manufacturing process of an amorphous silicon thin film transistor array substrate according to an embodiment of the invention.

DESCRIPTION OF EMBODIMENTS

Figure 1:
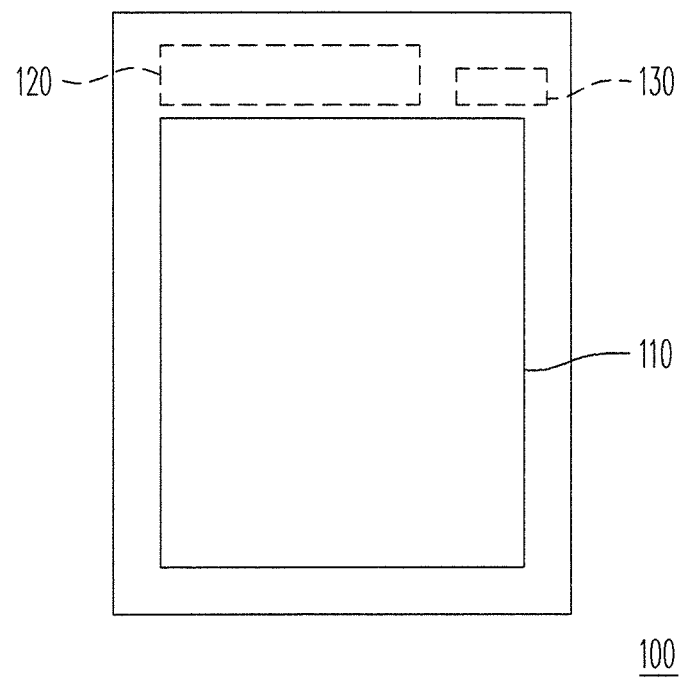
FIG. 1 illustrates a layout of a liquid crystal display panel incorporating a photo sensor according to an embodiment of the invention.

FIG. 1 illustrates a layout of a liquid crystal display panel incorporating a photo sensor according to an embodiment of the invention. As shown in FIG. 1, a liquid crystal display panel 100 has at least a display region 110, a peripheral circuit region 120 in the periphery of the display region 110, and a sensing region 130. The display region 110 has a plurality of pixel units to display a frame. Possible driving elements such as a scan driver or a data driver are disposed in the peripheral circuit region 120. The sensing region 130 is used for disposing a photo sensor to detect intensity of ambient light and accordingly adjust brightness of a backlight source of the display so as to achieve power conservation. Meanwhile, by detecting intensity of ambient light, brightness and contrast of the liquid crystal display panel may be automatically adjusted so that not only fatigue of the eye resulted from high brightness and reflection can be reduced but energy consumption of the liquid crystal display panel can also be decreased.

In the present embodiment, the sensing region 130 is selectively disposed in a region outside the display region 110 for disposing the photo sensor. However, in other embodiments of the invention, a dummy pixel region may exist in the periphery of the display region closely adjacent to a sealant. At this time, the photo sensor may be selectively disposed in the dummy pixel region without affecting display effect of pixels in other normal display regions.

Figure 2:
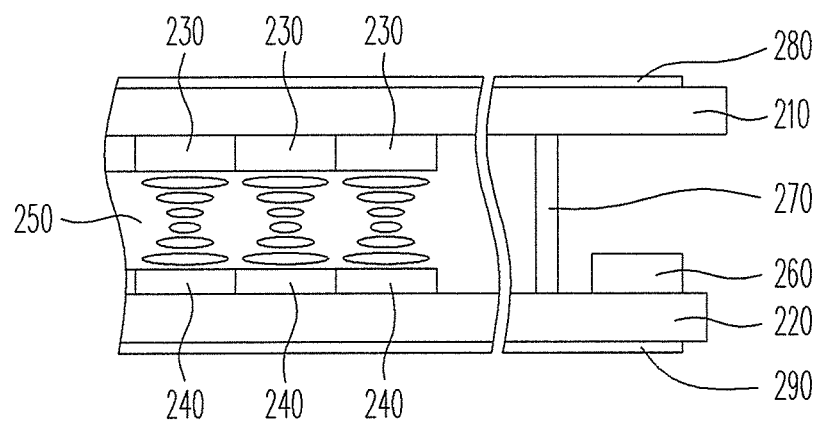
FIG. 2 is a possible cross-sectional schematic diagram illustrating the liquid crystal display panel in FIG. 1.

FIG. 2 is a cross-sectional schematic diagram illustrating the liquid crystal display panel in FIG. 1. As shown in FIG. 2, the liquid crystal display panel 100 has an upper substrate 210 and a lower substrate 220. A plurality of color filter units 230, for example, are formed on the upper substrate 210 and a plurality of pixel structures 240, for example, are formed on the lower substrate 220. In addition, a liquid crystal layer 250 is sealed by a sealant 270 between the upper substrate 210 and the lower substrate 220. Polarizers 280 and 290 are respectively adhered to outside surfaces of the upper substrate 210 and the lower substrate 220. As shown in FIG. 1, in the present embodiment, manufacture of a photo sensor 260 is integrated in the manufacture of the lower substrate 220 and the photo sensor 260 is disposed in the sensing region outside the display regions 110 (in reference to FIG. 1).

The afore-mentioned lower substrate 220 in the above embodiment and the possible elements disposed thereon are referred to as a thin film transistor array substrate (e.g. a low temperature poly-silicon thin film transistor array substrate), wherein a semiconductor layer required by the thin film transistor is foamed on the substrate by a low temperature poly-silicon technology. The description below takes the low temperature poly-silicon thin film transistor array substrate as an example to illustrate the relevant technical content of the manufacturing process of a thin film transistor array substrate incorporating a photo sensor of the invention.

Figure 3:
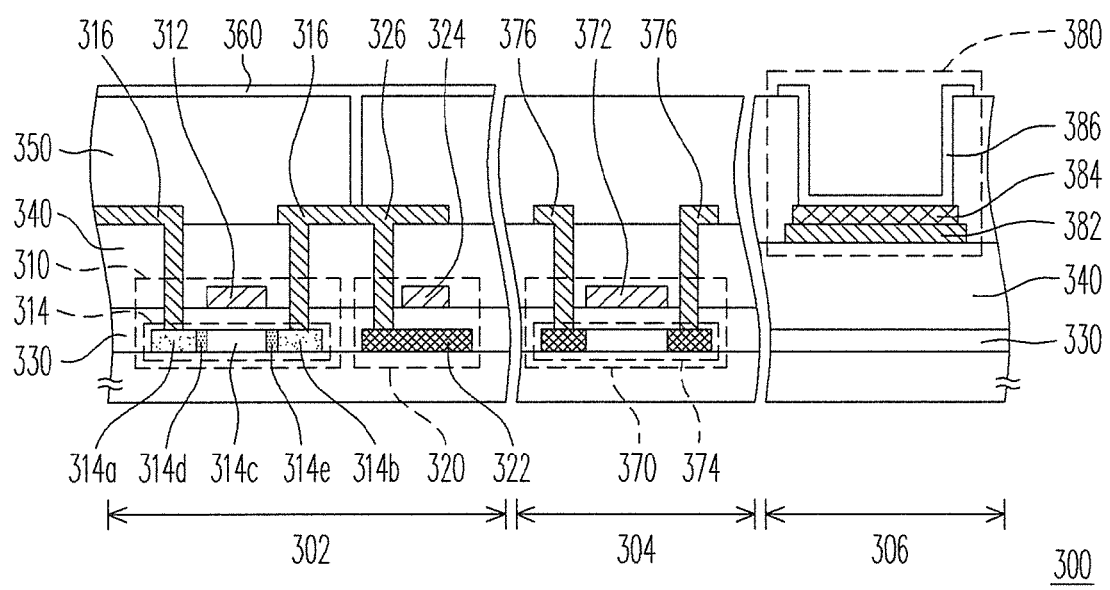
FIG. 3 illustrates a thin film transistor array substrate according to an embodiment of the invention.

FIG. 3 illustrates a thin film transistor array substrate according to one embodiment of the invention. For the purpose of simplification, elements in plural may be shown as singular in FIG. 3.

Referring to FIG. 3, a thin film transistor array substrate 300 is divided into as least a display region 302, a peripheral circuit region 304, and a sensing region 306. The display region 302 has display thin film transistors 310 arranged in array. Under possible conditions, the display thin film transistors 310 are combined with a storage capacitor 320 to provide a better display effect. The display thin film transistor 310 mainly includes a gate electrode 312 and a semiconductor layer 314. A material of the semiconductor layer 314 may be poly-silicon or other semiconductor material. A doped source region 314a, a channel region 314c, and a doped drain region 314b are further formed in the semiconductor layer 314. In addition, a lightly doped source region 314d and a lightly doped drain region 314e may be selectively formed in the semiconductor layer 314. The names of the doped source region 314a and the doped drain region 314b may interchanged according to the electrical requirement and may be so as to the lightly doped source region 314d and the lightly doped drain region 314e. A gate insulation layer 330 covers the semiconductor layer 314 and is fanned of dielectric material. The gate electrode 312 is located on the gate insulation layer 330 on the channel region 314c. In addition, a storage electrode 322 of the storage capacitor 320 and the semiconductor layer 314 are both of poly-silicon material. The gate insulation layer 330 also covers the storage electrode 322. A storage electrode 324 of the storage capacitor 320 is located on the gate insulation layer 330 on the storage electrode 322. The storage electrode 324 and the gate electrode 312 are both made of metal material.

Referring to FIG. 3 again, an inter-layer dielectric layer 340 is located on the gate insulation layer 330 and covers the gate electrode 312 of the thin film transistor 310 and the storage electrode 324 of the storage capacitor 320. A contact metal plug 316 passes through the inter-layer dielectric layer 340 and the gate insulation layer 330 and is coupled to the corresponding doped source region 314a and the doped drain region 314b. A connecting metal line 326 passes through the inter-layer dielectric layer 340 and the gate insulation layer 330 via the contact metal plug 316 and electrically couples the storage capacitor 320 to the thin film transistor 310. As shown in FIG. 3, the storage electrode 322 electrically connects to the doped drain region 314b by the connecting metal line 326. Moreover, a protection layer 350 is further disposed on the inter-layer dielectric layer 340 and covers the contact metal plug 316. The protection layer 350 further has a pixel electrode 360 thereon which passes through the protection layer 350 and is electrically coupled downward to the display thin film transistor 310.

Referring to FIG. 3 again, the peripheral circuit region 304 has elements such as P-type thin film transistors, N-type thin film transistors, or CMOS transistors. One feature of the poly-silicon thin film transistor array substrate 300 disclosed in the present embodiment lies in that the elements in the display region 302 and the peripheral circuit region 304 can be manufactured in the same process. For example, a peripheral thin film transistor 370 in the peripheral circuit region 304 can be manufactured at the same time as the display thin film transistor 310 in the display region 302 to form a gate electrode 372, a semiconductor layer 374, a contact metal plug 376, etc. To carry it further, the semiconductor layer 374 and the semiconductor layer 314 are, for example, formed by patterning the same poly-silicon material layer. The gate electrode 372 and the gate electrode 312 are, for example, formed by patterning the same metal layer. The contact metal plug 376, the contact metal plug 316, and the connecting metal line 326 are manufactured with the same steps and the same metal material.

Referring to FIG. 3 again, in the present embodiment, a photo sensor 380 is formed in the sensing region 306. The photo sensor 380 includes a photo sensing electrode 382 on the inter-layer dielectric layer 340, a photo sensitive dielectric layer 384 on the photo sensing electrode 382, and a photo sensing electrode 386 passing through the protecting layer 350 and contacting the photo sensitive dielectric layer 384 The photo sensing electrode 382 may be electrically connected to a signal read circuit disposed in the peripheral circuit region 304, for example, to read light intensity sensed by the photo sensitive dielectric layer 384. In the present embodiment, the photo sensing electrode 382, the contact metal plug 376, the contact metal plug 316, and the connecting metal line 326 are formed by patterning the same metal layer, for example. The sensing electrode 386 and the pixel electrode 360 are formed by patterning the same transparent conductive layer, for example. Furthermore, the photo sensitive dielectric layer 384 is, for example, a silicon-rich dielectric layer and is formed by a chemical vapor deposition process in which process gas ratio is controlled to reach an excessive silicon content higher than a proper chemical ratio (i.e. stoichiometry) to form the silicon-rich dielectric layer. In addition, silicon nanocrystals may be further formed in the silicon-rich dielectric layer in association with the excimer laser annealing process. The diameter of the silicon nanocrystal is between 0.5 to 200 nm so as to form a silicon nanocrystal dielectric layer to obtain better electrical and photo sensing effect. Practical and suitable materials include silicon rich oxide (SiOx), silicon rich nitride (SiNy), silicon rich oxynitride (SiOxNy), silicon rich carbide (SiCz), silicon rich oxycarbide (SiOxCz), hydrogenated silicon rich oxide (SiHwOx), hydrogenated silicon rich nitride (SiHwNy), or hydrogenated silicon rich oxynitride (SiHwOxNy), wherein w is between 0.01 and 4, x is between 0.01 and 2, and y is between 0.01 and 1.34, z is between 0.01 to 1. The invention is not limited to the above materials. Other silicon-rich compound may be used to replace the above materials.

To better explain the technical content of the invention, the following description in association with the accompanied drawings further illustrates the manufacturing method of the thin film transistor array substrate of the invention.

Refer to FIGS. 4A~4J which sequentially illustrate a manufacturing process of a thin film transistor array substrate according to an embodiment of the invention.

Figure 4A:
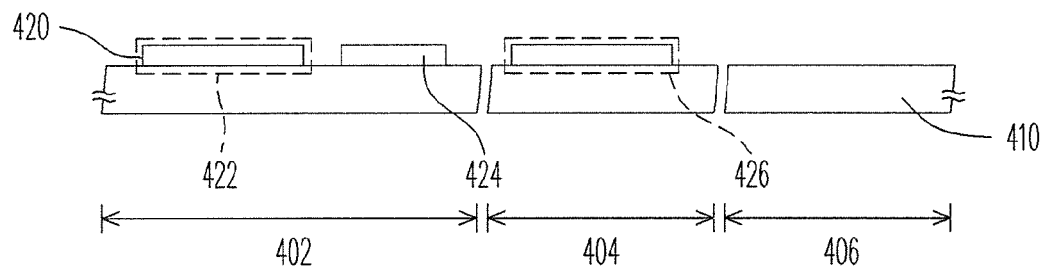
FIGS. 4A~4J sequentially illustrate a manufacturing process of a thin film transistor array substrate according to an embodiment of the invention.

First, as shown in FIG. 4A, a substrate 410 is provided and a patterned semiconductor layer is formed on the substrate 410. The substrate 410 is, for example, a glass substrate or a plastic substrate and is divided into at least a display region 402, a peripheral circuit region 404, and a sensing region 406. The related disposition is as illustrated above. The patterned semiconductor layer is, for example, a poly-silicon layer 420 which may be formed with an amorphous silicon material layer by the excimer laser annealing process. The poly-silicon layer 420, after being patterned, is formed into a semiconductor block (or a semiconductor island) 422 in the display region 402, a storage electrode 424, and a semiconductor block 426 in the peripheral circuit region 404.

Figure 4B:
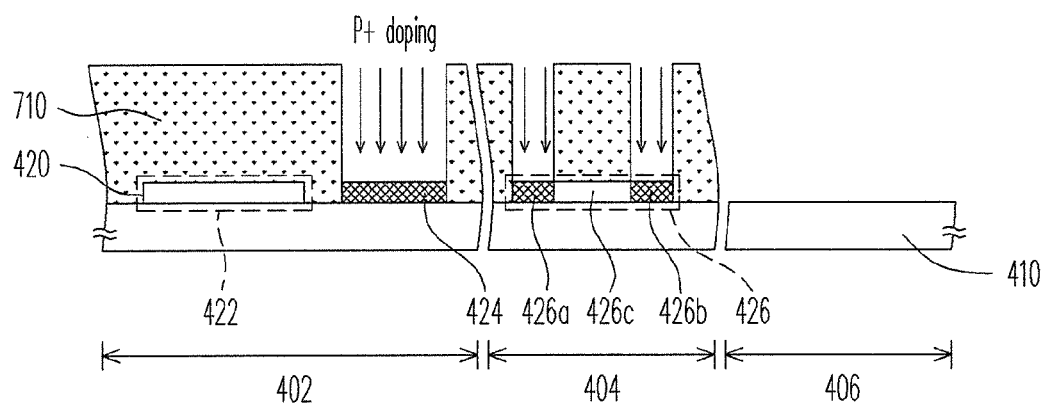

Next, as shown in FIG. 4B, a patterned mask 710 is formed on the substrate 410. A first conductive type doping (e.g. P+ ion doping) is performed on the poly-silicon layer 420 exposed by the patterned mask 710. In more detail, the patterned mask 710 exposes the storage electrode 424 and part of the semiconductor block 426. Through the P+ ion doping, the storage electrode 424 is conductive and a doped source region 426a, a doped drain region 426b, and a channel region 426c are formed in the semiconductor block 426.

Figure 4C:
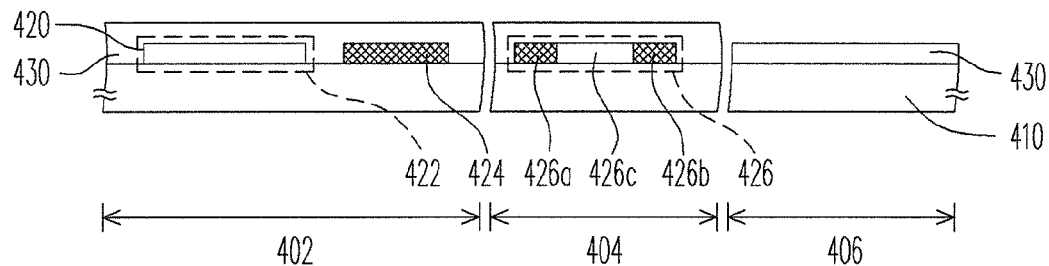
Figure 4D:
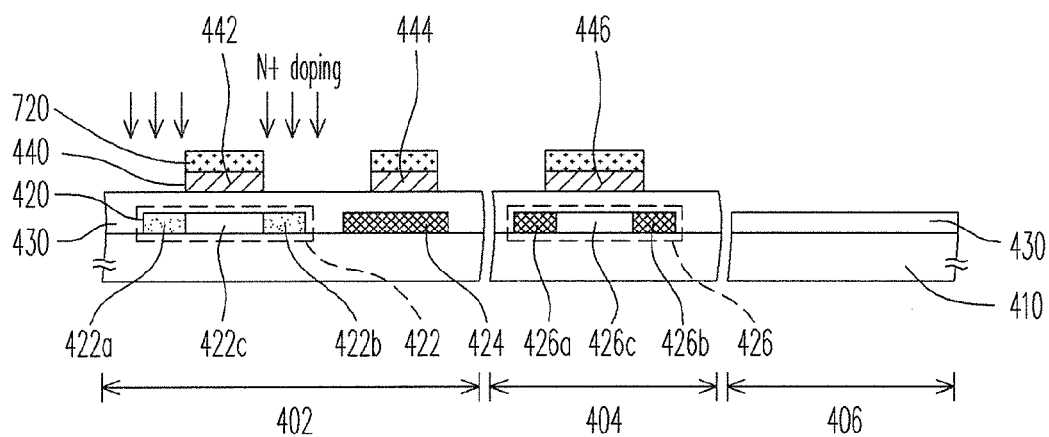

Next, as shown in FIG. 4C, a gate insulation layer 430 is formed on the substrate 410 to cover the semiconductor block 426 and the storage electrode 424. The gate insulation layer 430 is formed of dielectric material. In addition, as shown in FIG. 4D, a metal layer 440 is formed on the gate insulation layer 430 and is patterned to form a gate electrode 442, a storage electrode 444, and a gate electrode 446. At this time, the patterned mask 720 still remains on the patterned metal layer 440. Therefore, the remaining patterned mask 720 and the metal layer 440 are used as a mask to perform a second conductive type doping (e.g. an N+ ion doping) to form a doped source region 422a and a doped drain region 422b in the semiconductor block 422. At this time, if doping is only to be performed on the semiconductor block 426 of the display region 402, a metal shielding mask (not shown) may be selectively used to shield the area outside the display region 402.

Figure 4E:
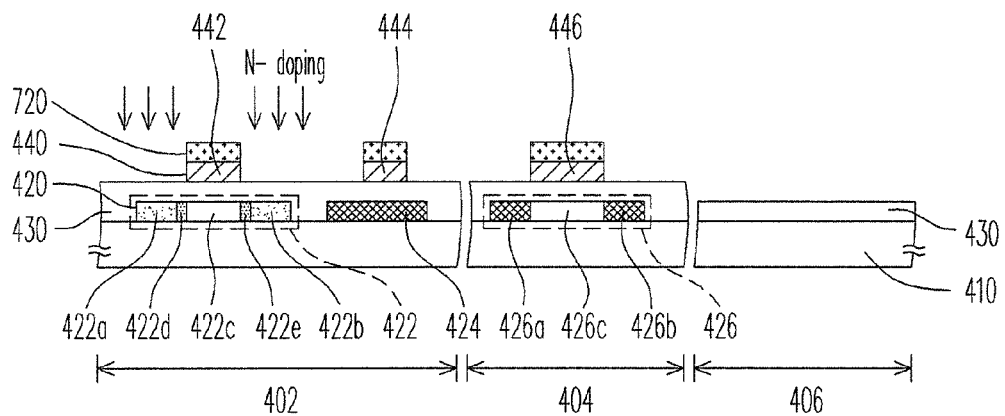

Then, as shown in FIG. 4E, isotropic etching is performed on the remaining patterned mask 720 and part of the metal layer 440 is further removed through the patterned mask 720. At this time, the etched gate electrode 442 further exposes part of the semiconductor block 422 that is not doped and then N− ion doping with light dosage is performed on the exposed semiconductor block 422 to form a lightly doped source region 422d and a lightly doped drain region 422e as shown in FIG. 4E and define a channel region 422c. Thereby, the lightly doped source region 422d is formed between the doped source region 422a and the channel region 422c and the lightly doped drain region 422e is formed between the doped drain region 422b and the channel region 422c.

Figure 4F:
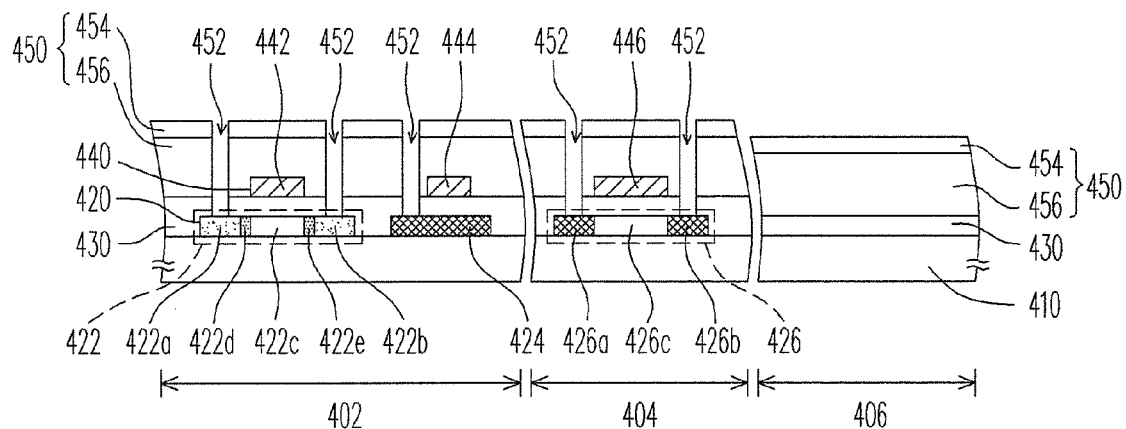

Next, as shown in FIG. 4F, the remaining patterned mask 720 is removed. An inter-layer dielectric layer 450 is formed on the gate insulation layer 430 to cover the metal layer 440. In addition, a plurality of via holes 452 are formed in the inter-layer dielectric layer 450 and the gate insulation layer 430 to respectively expose the corresponding doped source regions 422a and 426a, the doped drain regions 422b and 426b, and the storage electrode 424. It should be mentioned that composition of the inter-layer dielectric layer 450 may be single layered or multi-layered according to actual requirement. In more detail, a material of the inter-layer dielectric layer 450 may be adjusted according to a material of the subsequently formed photo sensitive dielectric layer. Take the inter-layer dielectric layer 450 illustrated in the present embodiment as an example. If the inter-layer dielectric layer 450 is a single layered silicon oxide layer, the silicon oxide layer may be used as an etching barrier layer. The subsequently formed photo sensitive dielectric layer may adopt silicon rich nitride as a material which has a better etching selectivity ratio to silicon oxide. Furthermore, if the inter-layer dielectric layer 450 includes a silicon nitride ($Si_3N_4$) layer 454 of an upper dielectric layer and a silicon oxide ($SiO_2$) layer 456 of a lower dielectric layer, the silicon nitride ($Si_3N_4$) layer 454 of an upper dielectric layer acts as the etching barrier layer and the material of the subsequently formed photo sensitive dielectric layer may adopt silicon-rich oxide (SiOx) or select a material having a better etching selectivity ratio to silicon nitride. Subsequently used etching gas has a lower etching rate on the inter-layer dielectric layer 450 than on the subsequently formed photo sensitive dielectric layer and a lower etching rate on the etching barrier layer 454 than on the inter-layer dielectric layer 450 and on the subsequently formed photo sensitive dielectric layer so that over etching on the inter-layer dielectric layer 450 can be prevented.

Figure 4G:
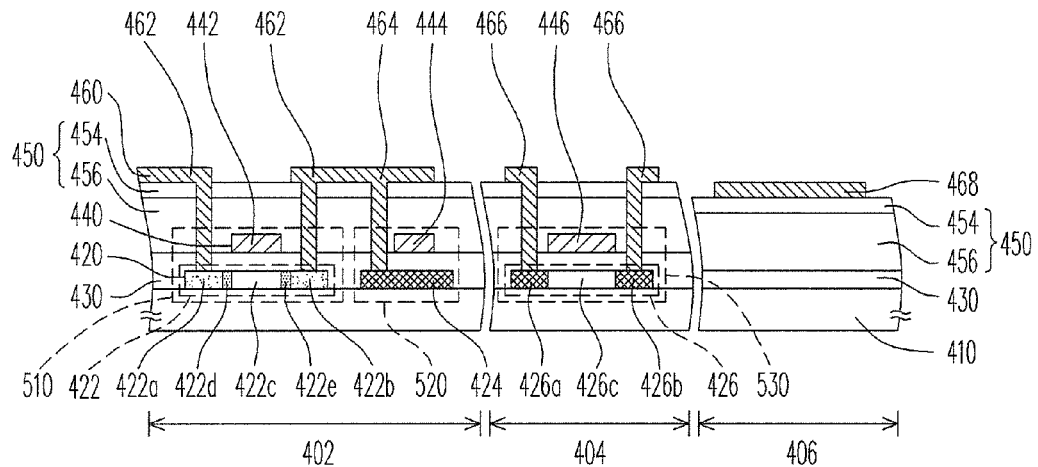

Then, as shown in FIG. 4G, a metal layer 460 is foamed on the inter-layer dielectric layer 450 and is filled in the via hole 452 to form contact metal plugs 462 and 466. The metal layer 460 is patterned (e.g. by performing a photolithographic and etching process) to form a connecting metal line 464 and a sensing electrode 468. A material of the metal layer 460 may be, in addition to metal, other conductive material or a stacked layer. The gate electrode 442 and the corresponding semiconductor block 422 form a display thin film transistor 510. The contact metal plug 462 is coupled to the doped source region 422a or the doped drain region 422b of the corresponding display thin film transistor 510 through the corresponding via hole 452. The storage electrode 424, the gate insulation layer 430, and the storage electrode 444 form a storage capacitor 520. The connecting metal line 464 electrically couples the corresponding storage capacitor 520 to the corresponding display thin film transistor 510 through the corresponding first via hole 452 and the contact metal plug 462 therein. As shown in the figure, the storage electrode 424 is electrically coupled to the doped drain region 422b through the connecting metal line 464. In addition, the gate electrode 446 in the peripheral circuit region 404 and the corresponding semiconductor block 426 form a peripheral thin film transistor 530. The contact metal plug 466 is coupled to the doped source region 426a or the doped drain region 426b of the corresponding peripheral thin film transistor 530 through the corresponding via hole 452.

Figure 4H:
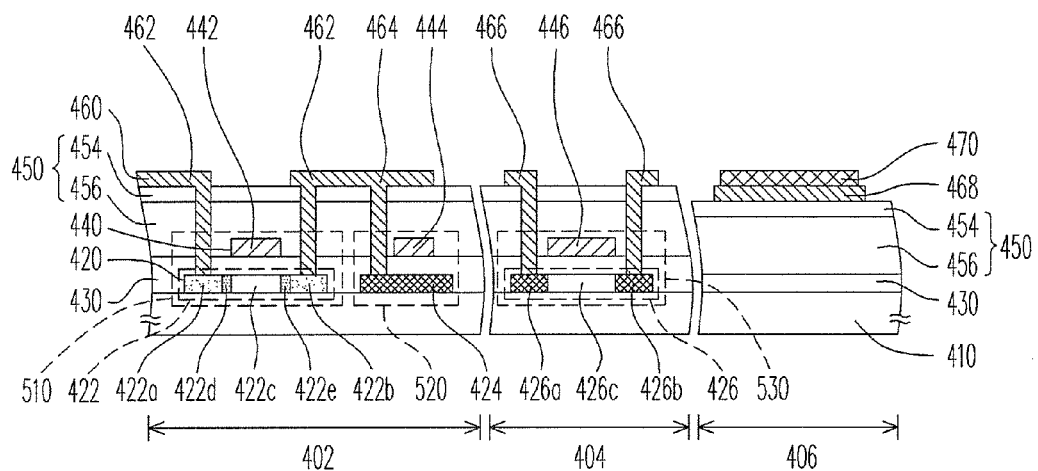

Next, as shown in FIG. 4H, a patterned photo sensitive dielectric layer 470 is formed on the photo sensing electrode 468. A method of forming the patterned photo sensitive dielectric layer 470 includes, for example, by plasma enhanced chemical vapor deposition, forming a silicon-rich dielectric layer such as a silicon rich oxide layer, a silicon rich nitride layer, a silicon rich oxynitride layer, or other silicon rich material layer. In addition, an excimer laser annealing process or thermal annealing process may be selectively further performed on the formed material layer to form a silicon nanocrystal dielectric layer having better electrical and photo sensing characteristics. Then, a photolithographic and etching process is performed on the photo sensitive dielectric layer 470 to form the required pattern. The etching gas has a higher etching rate on the photo sensitive dielectric layer 470 than on the inter-layer dielectric layer 450 and an even higher etching rate on the etching barrier layer 454 so that over etching on the inter-layer dielectric layer 450 can be prevented.

Figure 4I:
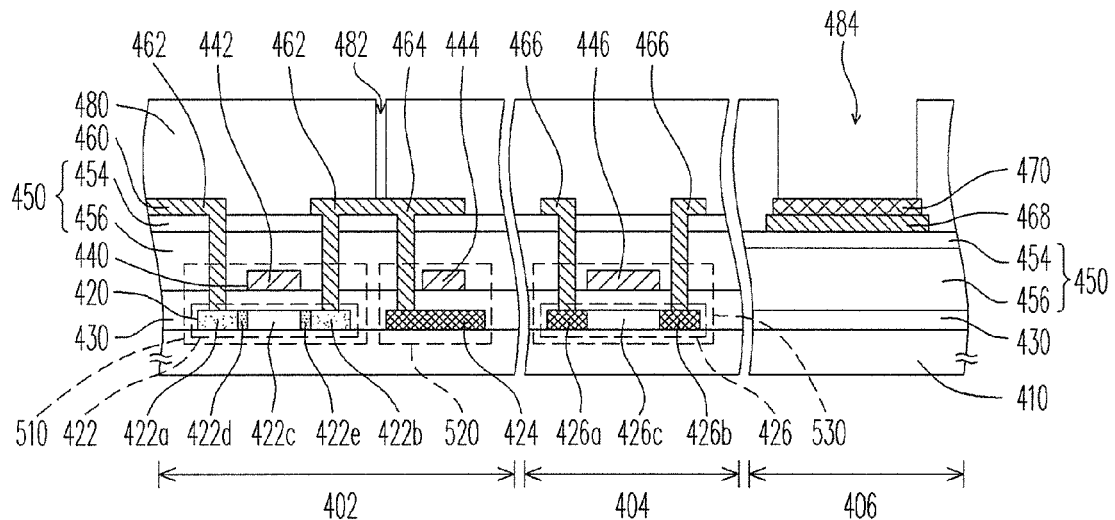

Afterwards, as shown in FIG. 4I, a protection layer 480 is formed on the inter-layer dielectric layer 450 to cover the metal layer 460 and the photo sensitive dielectric layer 470. The protection layer 480 may selectively use an organic material layer and may also act as a planar layer. Furthermore, a plurality of via holes 482 and an opening 484 are formed in the protection layer 480. The via holes 482 respectively expose the corresponding connecting metal line 464 or contact metal plugs 462 and 466. The opening 484 exposes the photo sensitive dielectric layer 470.

Figure 4J:
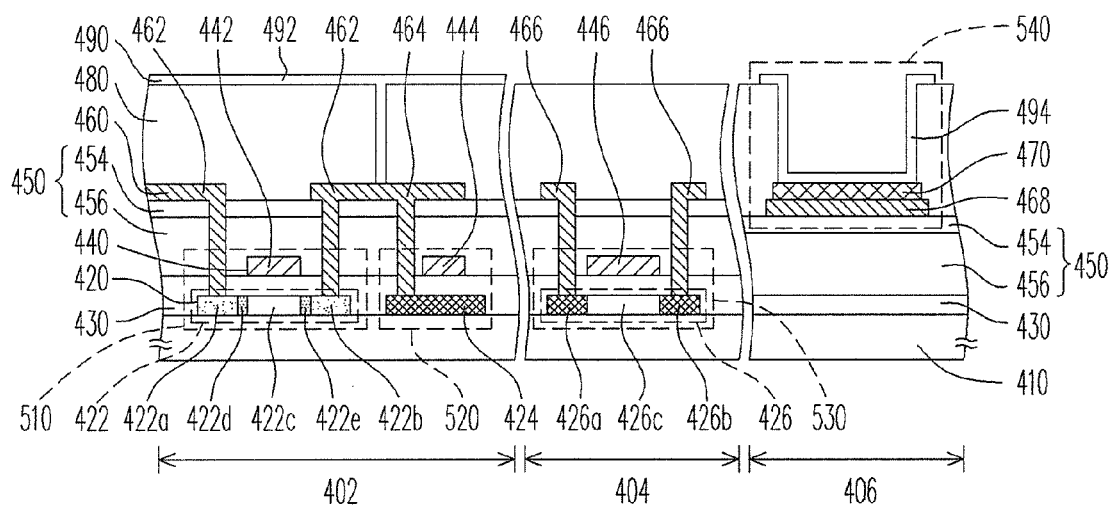

Subsequently, as shown in FIG. 4J, a transparent conductive layer 490 is formed on the protection layer 480. The transparent conductive layer 490 is patterned to form a pixel electrode 492 and a sensing electrode 494. A material of the transparent conductive layer 490 is, for example, indium tin oxide (ITO), Indium Zinc Oxide (IZO), or other transparent conductive material. The pixel electrode 492 is coupled to the corresponding connecting metal line 464 or contact metal plug 462 through the corresponding via hole 482. The sensing electrode 494 is stacked on the photo sensitive dielectric layer 470 through the opening 484 and contacts the photo sensitive dielectric layer 470. As such, a photo sensor 540 is formed with the sensing electrode 494, the photo sensitive dielectric layer 470, and the sensing electrode 468 to detect change in ambient light. The sensing electrode 494 of the photo sensor 540 is a transparent conductive layer so incident light may directly pass through the sensing electrode 494 and irradiate the photo sensitive dielectric layer 470. In manufacturing, the sensing area of the sensor 540 is thereby significantly increased and the sensing efficiency is enhanced. In addition, the sensing electrode 468 is a metal electrode so backlight source can be prevented from directly irradiating the photo sensitive dielectric layer 470 and thus possible influence by noise can be avoided.

The above embodiment uses a seven-step CMOS (complementary metal-oxide-semiconductor) mask process in association with a mask process for the photo sensitive dielectric layer as an example for illustration, wherein the display thin film transistor may be an N-type doped thin film transistor (NMOS) and the peripheral thin film transistor may be a P-type doped thin film transistor (PMOS). However, the afore-mentioned seven-step CMOS mask process and the doping types of the display thin film transistor and the peripheral thin film transistor may be modified according to actual requirement without departing from the scope of the invention. For example, the CMOS mask process may entirely be replaced with a PMOS or an NMOS mask process.

For instance, in a modified embodiment of the invention, before selectively performing the P-type ion doping as shown in FIG. 4B, N-type ion doping is first performed on the semiconductor layer of the display thin film transistor. An additional step of mask process is required to define a region of the N-type ion doping. Therefore, the manufacturing method includes a total of eight steps of the CMOS mask process in association with a mask process for the photo sensitive dielectric layer.

In addition, in another modified embodiment of the invention, the self-aligning N-type ion doping with light dosage as shown in FIG. 4E may be alternatively performed after the N-type ion doping in the above-mentioned eight-step CMOS mask process. At this time, an additional mask process is required to define a region of the N-type ion doping with light dosage. Therefore, the manufacturing method includes a total of nine steps of the CMOS mask process in association with a mask process for the photo sensitive dielectric layer.

Furthermore, although in the above embodiment, the display thin film transistor takes the N-type doped thin film transistor as an example and the peripheral thin film transistor takes the P-type doped thin film transistor as an example, in practice, the doping types may be interchanged as P-type ion doping and N-type ion doping. In addition, a lower electrode of the above-mentioned storage capacitor may also adopt N-type ion doping to manufacture.

The above embodiment takes the low temperature polysilicon thin film transistor array substrate as an example to illustrate the relevant technical content of the manufacturing processes of a thin film transistor array substrate incorporating a photo sensor of the invention. However, under possible conditions, the photo sensor may also be incorporated in other types of thin film transistor array substrate in the invention. In order for people skilled in the art to further comprehend the technology of the invention, the following description illustrates a manufacturing process of an amorphous silicon thin film transistor array substrate incorporating a photo sensor.

Refer to FIGS. 5A-5F which sequentially illustrate a manufacturing process of an amorphous thin film transistor array substrate according to an embodiment of the invention. For the purpose of simplification, possible elements such as common lines or storage capacitors are omitted in the present embodiment. However, persons of ordinary skill in the art should be able to determine the location and necessity of existence of the omitted elements according to current technology level in addition to the content of the above embodiments, which is not further described herein.

First, as shown in FIG. 5A, a substrate 810 is provided. The substrate 810 is, for example, a glass substrate or a plastic substrate and is divided into at least a display region 802 and a sensing region 806, of which relative disposition is as described above. In addition, a gate electrode 822 is formed in the display region 802.

Next, as shown in FIG. 5B, a gate insulation layer 830 is formed on the substrate 810 to cover the gate electrode 822 and a semiconductor block 840 of amorphous silicon material is formed on the gate insulation layer 830 on the gate electrode 822. In general, the semiconductor block 840 includes a channel layer 842 and an ohmic contact layer 844.

Figure 5C:
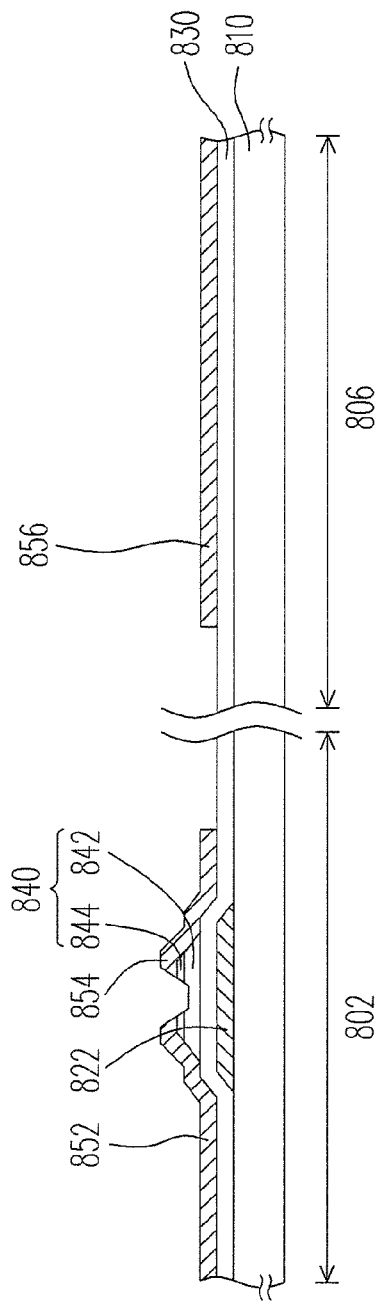

Then, as shown in FIG. 5C, a conductive layer (not shown) is formed on the substrate 810 and is patterned to simultaneously form a source 852, a drain 854, and a first sensing electrode 856. The names of the source 852 and the drain 854 may be interchanged according to electrical requirement.

Figure 5D:
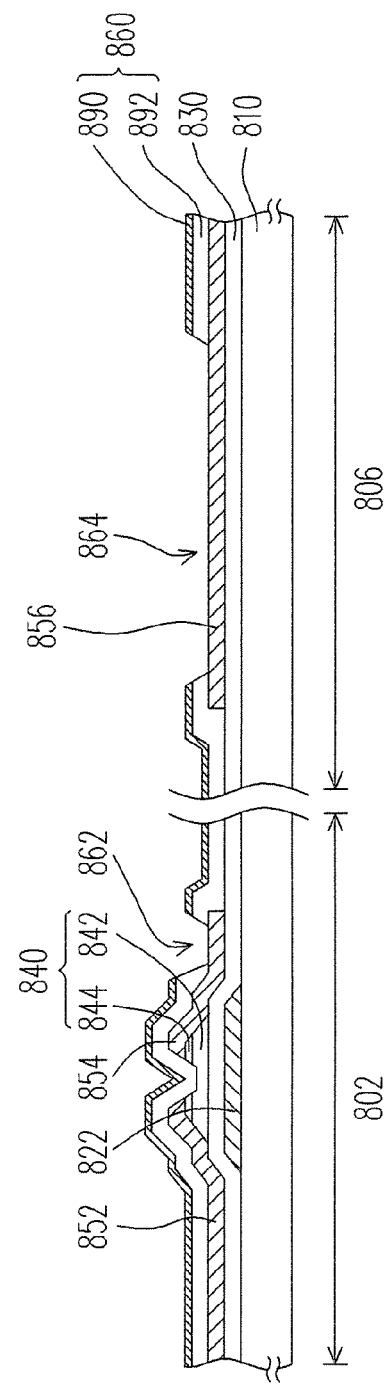

Subsequently, as shown in FIG. 5D, an inter-layer dielectric layer 860 is formed to cover the gate insulation layer 830 and various elements thereon. The inter-layer dielectric layer 860 here is also called a protection layer in some conditions. Furthermore, a via hole 862 and an opening 864 are also formed in the inter-layer dielectric layer 860. The via hole 862 exposes part of the source 852 or drain 854 and the opening 864 exposes the sensing electrode 856.

Next, as shown in FIG. 5E, a patterned photo sensitive dielectric layer 870 is formed on the photo sensing electrode 856 exposed by the opening 864. As described in the previous embodiment, a method of forming the patterned photo sensitive dielectric layer 870 includes, for example, by plasma enhanced chemical vapor deposition, forming a silicon-rich dielectric layer such as a silicon rich oxide layer, a silicon rich nitride layer, a silicon rich oxynitride layer, or other silicon rich material layer. In addition, an excimer laser annealing process or thermal annealing process may be selectively further performed on the formed material layer to form a silicon nanocrystal dielectric layer having better electrical and photo sensing characteristics. Then, a photolithographic and etching process is performed such that the photo sensitive dielectric layer 870 forms a required pattern.

Subsequently, as shown in FIG. 5F, a transparent conductive layer 880 is formed on the protection layer 860. The transparent conductive layer 880 is patterned to form a pixel electrode 882 and a sensing electrode 884. A material of the transparent conductive layer 880 is, for example, indium tin oxide (ITO), Indium Zinc Oxide (IZO), or other transparent conductive material. The pixel electrode 882 is coupled to the corresponding source 852 or drain 854 through the corresponding via hole 862 and the sensing electrode 884 is located on the photo sensitive dielectric layer 870. As such, a photo sensor 940 is formed with the sensing electrode 884, the photo sensitive dielectric layer 870, and the sensing electrode 856 to detect change in ambient light. The sensing electrode 884 of the photo sensor 940 is a transparent conductive layer so external light may directly pass through the sensing electrode 884 and irradiate the photo sensitive dielectric layer 870. In manufacturing, the sensing area of the sensor 940 is thereby significantly increased and the sensing efficiency is enhanced. In addition, the sensing electrode 856 is a metal electrode so backlight source can be prevented from directly irradiating the photo sensitive dielectric layer 870 and thus possible influence by noise can be avoided.

It should be noted that in the above embodiments, the patterned photo sensitive dielectric layer is formed by first depositing a material layer and then etching the material layer. Therefore, during the etching process, over etching on the lower inter-layer dielectric layer may easily occur, which causes film thickness mura in the inter-layer dielectric layer and also decreases protection of the inter-layer dielectric layer on lower elements (e.g. thin film transistor).

In light of the above, in the invention, a material having a higher etching selectivity ratio to the photo sensitive dielectric layer is chosen to manufacture the inter-layer dielectric layer. In other words, etching gas has a higher etching rate on the photo sensitive dielectric layer than on the inter-layer dielectric layer. For example, if silicon rich nitride is used as the material for the photo sensitive dielectric layer, a material of the inter-layer dielectric layer is, for example, silicon oxide having better etching selectivity ratio to silicon rich nitride material. In addition, if the material of the photo sensitive dielectric layer is silicon rich oxide, a silicon nitride layer may be selected as a material of the inter-layer dielectric layer. Certainly, the inter-layer dielectric layer may also be stacked by a plurality of material layers and a material having a better etching selectivity ratio to the photo sensitive dielectric layer is selected as the material of the topmost material layer.

From another aspect, an etching barrier layer having an even higher etching selectivity ratio to the photo sensitive dielectric layer may be selectively foamed on the inter-layer dielectric layer after the inter-layer dielectric layer is formed to further reduce the problem of over etching on the lower inter-layer dielectric layer when patterning the photo sensitive dielectric layer. A material of the etching barrier layer may be selected as described above and may be in association with the material of the photo sensitive dielectric layer to obtain better manufacturing effect.

A further illustration on the manufacturing process of the amorphous silicon thin film transistor array substrate is given below with reference to FIGS. 5A-5F to more clearly explain the technical content of forming the etching barrier layer on the inter-layer dielectric layer in the invention.

In a modified embodiment, as shown in FIG. 5D, in addition to being a single layer, the inter-layer dielectric layer 860 may be formed of a lower dielectric layer 892 and then an etching barrier layer 890 on the lower dielectric layer 892. In addition, the via hole 862 and the opening 864 are simultaneously formed in the etching barrier layer 890 and the lower dielectric layer 892. At this time, a material of the etching barrier layer 890 may be selected according to the material of the subsequently formed photo sensitive dielectric layer 870 as described above. A material having better etching selectivity ratio to the photo sensitive dielectric layer 870 is chosen as the material of the etching barrier layer 890. Preferably, the photo sensitive dielectric layer 870 has a higher etching selectivity ratio to the etching barrier layer 890 than to the lower dielectric layer 892.

As such, in the modified embodiment, when performing the patterning process as shown in FIG. 5E, the lower dielectric layer 892 has protection of the etching barrier layer 890 thereon so even if there is over etching, the over etching does not affect the lower dielectric layer 892 of which the integrity may be kept. In addition, if a material having a better etching selectivity ratio to the photo sensitive dielectric layer 870 is chosen to manufacture the etching barrier layer 890, the phenomenon of over etching may be effectively reduced and process yield may be increased.

The technology of forming the etching barrier layer in the previous embodiment may be applied in the manufacturing process of a poly silicon thin film transistor array substrate as shown in FIG. 4A~4J to form an etching barrier layer on the inter-layer dielectric layer 450 to obtain similar effects. The detailed steps and content will not be further described herein.

Finally, as shown in FIG. 2, the upper substrate and the lower substrate are assembled and a liquid crystal layer is injected in between the upper substrate and the lower substrate to the required display panel.

Figure 6:
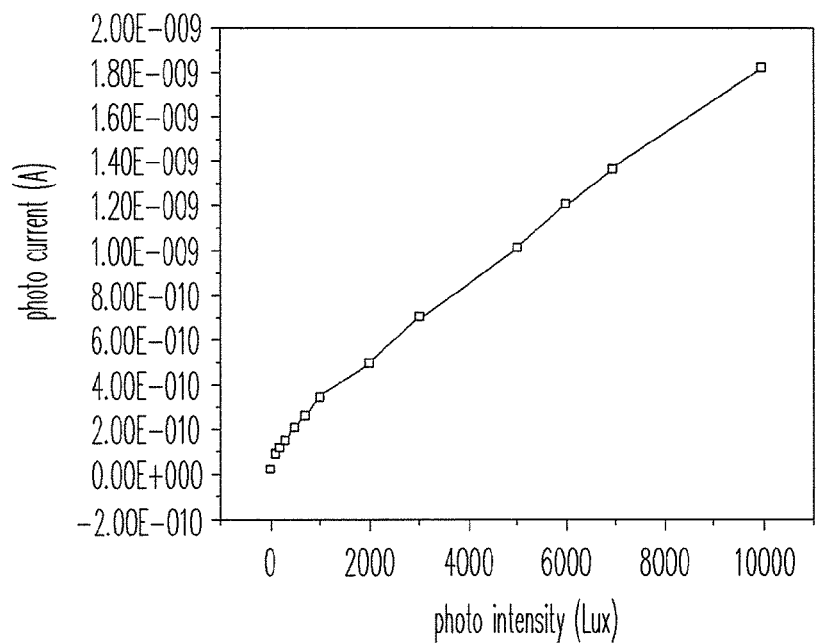
FIG. 6 illustrates characteristic curve of photo intensity of a photo sensor relative to photocurrent under practical operation.

FIG. 6 illustrates characteristic curve of photo intensity of a photo sensor relative to photocurrent under practical operation. In the exemplified embodiment, in the tested photo sensor, a material of an upper electrode is ITO and a lower electrode is a titanium/aluminum/titanium metal layer. Under the condition of applying a 3V bias voltage between the upper electrode and the lower electrode, an ideal linear relationship can be found between the photocurrent and photo intensity. In other words, the photo sensor of the invention can be practically used.

Figure 7:
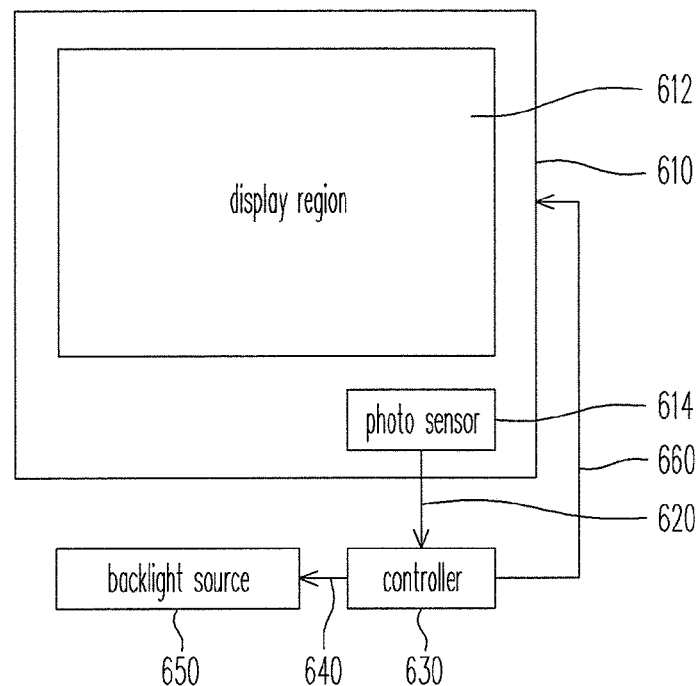
FIG. 7 illustrates a system structure of a liquid crystal display panel implementing ambient light sensing according to an embodiment of the invention.

FIG. 7 illustrates a system structure of a liquid crystal display panel implementing ambient light sensing according to an embodiment of the invention. As shown in FIG. 7, a liquid crystal display panel 610 has a display region 612 and a photo sensor 614 disposed outside the display region 612. In operation, the photo sensor 614 receives ambient light and outputs a sensing signal 620 to a controller 630. The controller 630 receives the sensing signal 620 and then selectively outputs a corresponding control signal 640 to a backlight source 650 to adjust brightness of the backlight source to conserve power. Furthermore, the controller 630 may selectively output a control signal 660 to the liquid crystal display panel 610 to automatically adjust brightness and contrast of the liquid crystal display panel 610 according to intensity of ambient light. The controller 630 may simultaneously output the control signal 640 and the control signal 660. Accordingly, fatigue of the eye due to high brightness and reflection can be reduced and so can the power consumption of the liquid crystal display panel 610.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a thin film transistor array substrate, comprising:
   providing a substrate having a display region and a sensing region, wherein at least a display thin film transistor is formed in the display region, a first sensing electrode is formed in the sensing region, and an inter-layer dielectric layer is disposed on the substrate, covers the display thin film transistor, and exposes the first sensing electrode;
   forming a patterned photo sensitive dielectric layer on the first sensing electrode; and
   forming a patterned transparent conductive layer on the substrate, wherein the patterned transparent conductive layer comprises a pixel electrode and a second sensing electrode, the pixel electrode is coupled to the corresponding display thin film transistor, and the second sensing electrode is located on the patterned photo sensitive dielectric layer.

2. The manufacturing method of a thin film transistor array substrate according to claim 1, wherein the inter-layer dielectric layer is first formed on the substrate and then the first sensing electrode is formed on the inter-layer dielectric layer.

3. The manufacturing method of a thin film transistor array substrate according to claim 2, after forming the patterned photo sensitive dielectric layer and before forming the patterned transparent conductive layer, further comprising:
   forming a protection layer on the inter-layer dielectric layer; and
   forming an opening in the protection layer to expose the photo sensitive dielectric layer, wherein the subsequently formed pixel electrode is located on the patterned protection layer and is coupled downward to the corresponding display thin film transistor, and the second sensing electrode is stacked on the photo sensitive dielectric layer through the opening.

4. The manufacturing method of a thin film transistor array substrate according to claim 1, wherein the first sensing electrode is first formed on the substrate, then the inter-layer dielectric layer is formed, and the inter-layer dielectric layer is patterned to expose the first sensing electrode.

5. The manufacturing method of a thin film transistor array substrate according to claim 4, wherein the first sensing electrode is formed simultaneously in the process of forming the display thin film transistor.

6. The manufacturing method of a thin film transistor array substrate according to claim 1, wherein steps of forming the inter-layer dielectric layer comprise:
   forming a lower dielectric layer;
   forming an etching barrier layer on the lower dielectric layer.

7. The manufacturing method of a thin film transistor array substrate according to claim 6, wherein the patterned photo sensitive dielectric layer has a higher etching selectivity ratio to the etching barrier layer than to the lower dielectric layer.

8. The manufacturing method of a thin film transistor array substrate according to claim 1, wherein the substrate further has a peripheral circuit region provided with at least a peripheral thin film transistor therein and the subsequently formed inter-layer dielectric layer further covers the peripheral thin film transistors.

9. The manufacturing method of a thin film transistor array substrate according to claim 1, wherein the patterned photo sensitive dielectric layer comprises a silicon rich dielectric layer.

10. The manufacturing method of a thin film transistor array substrate according to claim 9, wherein a material of the silicon rich dielectric layer comprises silicon rich oxide, silicon rich nitride, silicon rich oxynitride, silicon rich carbide, silicon rich oxycarbide, hydrogenated silicon rich oxide, hydrogenated silicon rich nitride, hydrogenated silicon rich oxynitride, or a combination thereof.

11. The manufacturing method of a thin film transistor array substrate according to claim 9, wherein a method of forming the silicon rich dielectric layer comprises performing a chemical vapor deposition process.

12. The manufacturing method of a thin film transistor array substrate according to claim 9, further comprising performing an excimer laser annealing process to form a silicon nanocrystal dielectric layer from the silicon rich dielectric layer.

13. A manufacturing method of a liquid crystal display panel, comprising:
   providing a first substrate having a display region and a sensing region, wherein at least a display thin film transistor is formed in the display region, a first sensing electrode is formed in the sensing region, and an inter-layer dielectric layer is disposed on the first substrate, covers the display thin film transistor, and exposes the first sensing electrode;
   forming a patterned photo sensitive dielectric layer on the first sensing electrode; and
   forming a patterned transparent conductive layer on the first substrate, wherein the patterned transparent conductive layer comprises a pixel electrode and a second sensing electrode, the pixel electrode is coupled to the corresponding display thin film transistor, and the second sensing electrode is located on the patterned photo sensitive dielectric layer; and assembling a second substrate with the first substrate and filling a liquid crystal layer between the first substrate and the second substrate.

\* \* \* \* \*